United States Patent [19]

Wilson et al.

[11] Patent Number: 5,384,555
[45] Date of Patent: Jan. 24, 1995

[54] COMBINED RF AND DIGITAL/DC SIGNALLING INTERCONNECT LAMINATE

[75] Inventors: Steven E. Wilson, Melbourne; Walter M. Whybrew, Palm Bay, both of Fla.

[73] Assignee: Harris Corporation, Melbourne, Fla.

[21] Appl. No.: 9,496

[22] Filed: Jan. 26, 1993

[51] Int. Cl.⁶ .......................................... H01P 5/00
[52] U.S. Cl. ...................................... 333/1; 333/243; 333/246
[58] Field of Search ................ 333/1, 236, 238, 246, 333/243; 174/117 F

[56] References Cited

U.S. PATENT DOCUMENTS

| | | | |
|---|---|---|---|
| 3,680,005 | 7/1972 | Jorgensen et al. | 333/236 X |
| 4,047,132 | 9/1977 | Krajewski | 333/238 |
| 4,641,140 | 2/1987 | Heckaman et al. | 333/236 X |
| 5,150,088 | 9/1992 | Virga et al. | 333/238 |

Primary Examiner—Paul Gensler
Attorney, Agent, or Firm—Charles E. Wands

[57] ABSTRACT

An interconnect laminate structure integrates RF and auxiliary (e.g. digital and D.C.) signalling capabilities in a common structure by means of a stacked conductor-plated dielectric configuration that facilitates access to and routing by channelline/waffleline RF transmission links and separate control (e.g. digital, power supply) links, without having to perform laborious manual routing tasks to effect auxiliary connectivity among the components of a network. The interconnect structure includes a first dielectric layer having a channel formed in a first surface thereof, the channel having a conductive surface and configured to accommodate the insertion of a dielectric coated conductor into the channel so as to form an RF transmission line. Second dielectric layers, each of which has a conductive layer formed on a first surface thereof, are mounted together with the first dielectric layer in a laminate assembly. Respective layers of adhesive are interleaved with the plurality of second dielectric layers together with the first dielectric layer in a laminate assembly.

19 Claims, 4 Drawing Sheets

SECTION A-A

SECTION A-A

COMBINED RF AND DIGITAL/DC SIGNALLING INTERCONNECT LAMINATE

The present application was developed under a proprietary U.S. government contract.

FIELD OF THE INVENTION

The present invention relates in general to communication systems and is particularly directed to an interconnect structure in which both RF and auxiliary (e.g. digital and D.C.) signalling capabilities are integrated together by means of a laminate configuration.

BACKGROUND OF THE INVENTION

U.S. Pat. Nos. 4,641,140 and 4,695,810 to D. Heckaman et al, assigned to the assignee of the present application and the disclosures of which are incorporated herein, describe various embodiments of compact RF signalling structures, known as 'channelline' and 'waffleline' configurations, in which a dielectric-clad conductor is placed in a conductive-walled channel, which forms the ground plane for the transmission line. Advantageously, such channelline and waffleline-configured transmission line architectures provide a physically 'thin' interconnect structure, that enables the overall physical size of both the interconnect structure and the attendant communication circuit components it interconnects to be housed in a very compact configuration, including conformal shapes for use on airborne and spaceborne-mounted platforms.

In the case of channelline, the transmission channel may follow an arbitrary path through the support structure, whereas waffleline has a matrix or grid-like structure of mesas and surrounding channels, taking on a waffle iron-like shape and having a prescribed characteristic impedance irrespective of the path followed by the conductor through the waffleline.

Because the communication circuit components with which such RF interconnect structures are employed require non-RF signalling links such as power and control (usually digital) signalling, it is necessary to provide separate signalling highways for that purpose. One technique that has been used in the case of a waffleline interconnect structure has been to route the auxiliary signalling wires through channels of the waffleline (other than those used for RF signalling). Because these auxiliary signalling wires are dimensioned smaller than the RF wires, they have been customarily installed by hand, usually with multiple wires being placed together in the same channels, so as to cause a bundling of the wires as they are routed through among the mesas of the waffleline. An additional mechanism has involved the use of a separate printed circuit board across which the auxiliary signalling wires are routed, the separate printed circuit board being attached (typically by way of stand-offs and bolts) to the channelline or waffleline structure, so that it involves both the installation of a separate routing fixture and the need to wire that fixture by hand.

SUMMARY OF THE INVENTION

In accordance with the present invention, the above described shortcomings of conventional interconnect schemes employed in association with channelline and waffleline architectures are obviated by a new and improved interconnect structure in which both RF and auxiliary (e.g. digital and D.C.) signalling capabilities are integrated together by means of a conductor-plated dielectric 'laminate' configuration.

More particularly, the integrated RF and auxiliary signalling capability interconnect structure in accordance with the present invention comprises a conductor-plated dielectric laminate structure, in which channelline or waffleline-based RF interconnect is provided in a first dielectric layer of the laminate, while auxiliary signalling lines are provided by way of patterned conductors of multiple additional layers of dielectric which are spaced apart from one another and the RF link-supporting dielectric layer in a multiple layer stack.

The RF interconnect layer is formed of a first dielectric layer having a channel (e.g. a channelline channel or a waffleline channel) formed in a first surface of the layer, the channel having a conductive surface and configured to accommodate the insertion of a dielectric coated conductor into the channel. The auxiliary signalling link-supporting laminate structure comprises a plurality of second dielectric layers each of which has a conductive layer formed on a first surface of the layer, with the plurality of second dielectric layers being mounted together with the first dielectric layer in a laminate assembly, by means of respective layers of adhesive material.

Signalling lines on the second dielectric layers are formed by patterning the plated-conductor layers into respective lengths of digital signal-conveying and D.C. potential-conveying conductor strips. One or more interconnect apertures may extend through the first dielectric layer so as to intersect the channel and further through the auxiliary signalling laminate structure, so that a respective conductor may pass through the aperture and be joined with a center conductor of the dielectric clad RF link that has been placed in the channel. Optionally, the center conductor itself may extend through the aperture to an outermost surface upon which a circuit component, such as a TO-type element or a microstrip circuit is provided. One of the second dielectric layers of the auxiliary signalling laminate structure may have a ground plane layer formed on one of its surface, the ground plane layer being connected to the conductive surface of the channel. Where a layer of microstrip is provided on the outermost dielectric layer, the ground plane layer may be formed either on the opposite interior side of that dielectric layer or on the surface of an adjacent dielectric layer.

DETAILED DESCRIPTION

Figure 1:
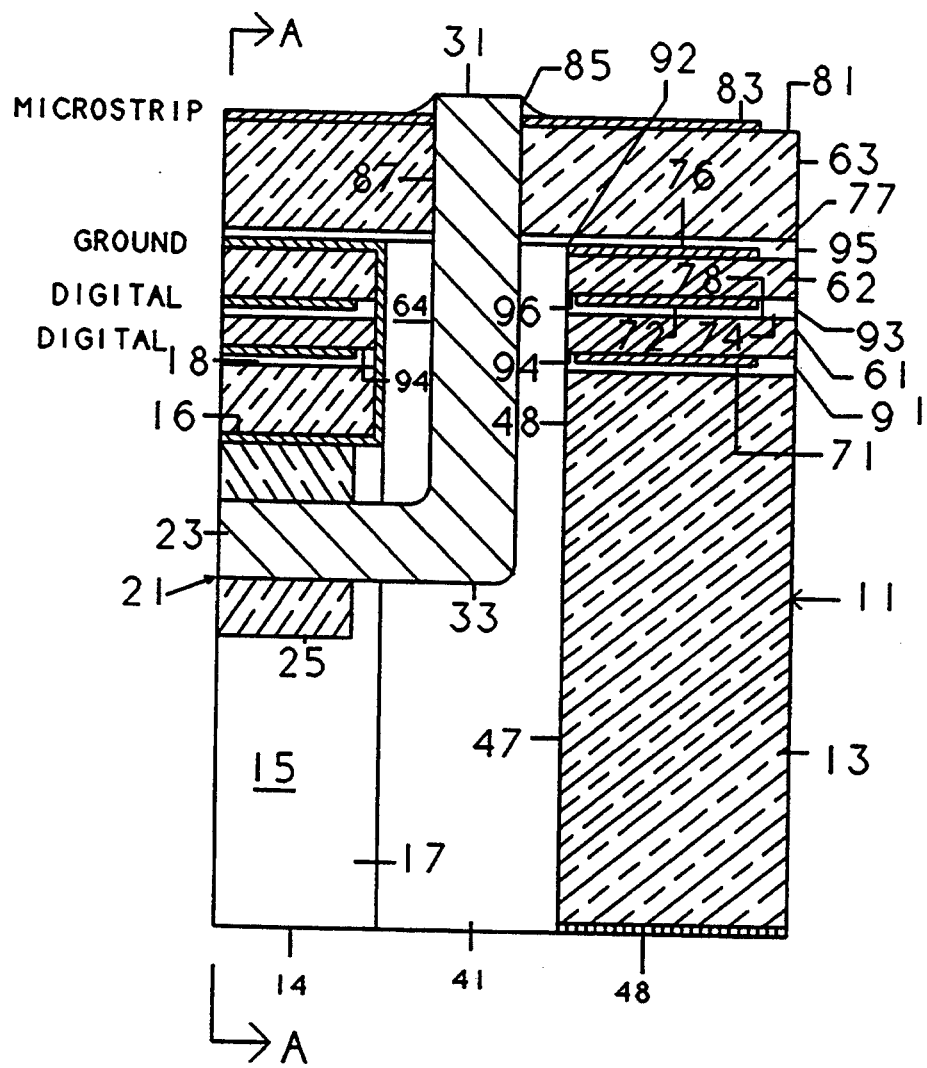
FIG. 1 is a diagrammatic cross-sectional illustration of an embodiment of an interconnect structure in accordance with the present invention in which both RF and auxiliary signalling capabilities are integrated together in a laminate configuration.
Figure 1A:
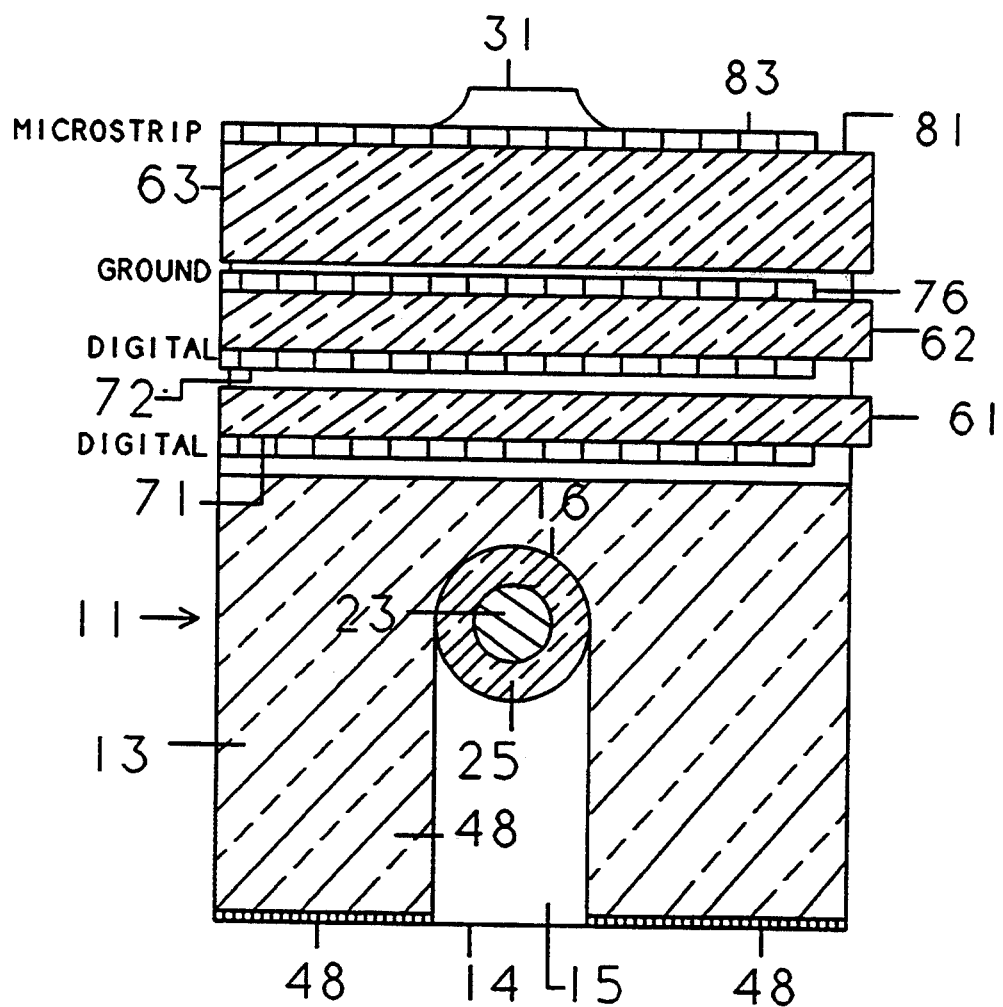
FIG. 1A is an end sectional view of FIG. 1 taken along lines A—A of FIG. 1.
Figure 2:
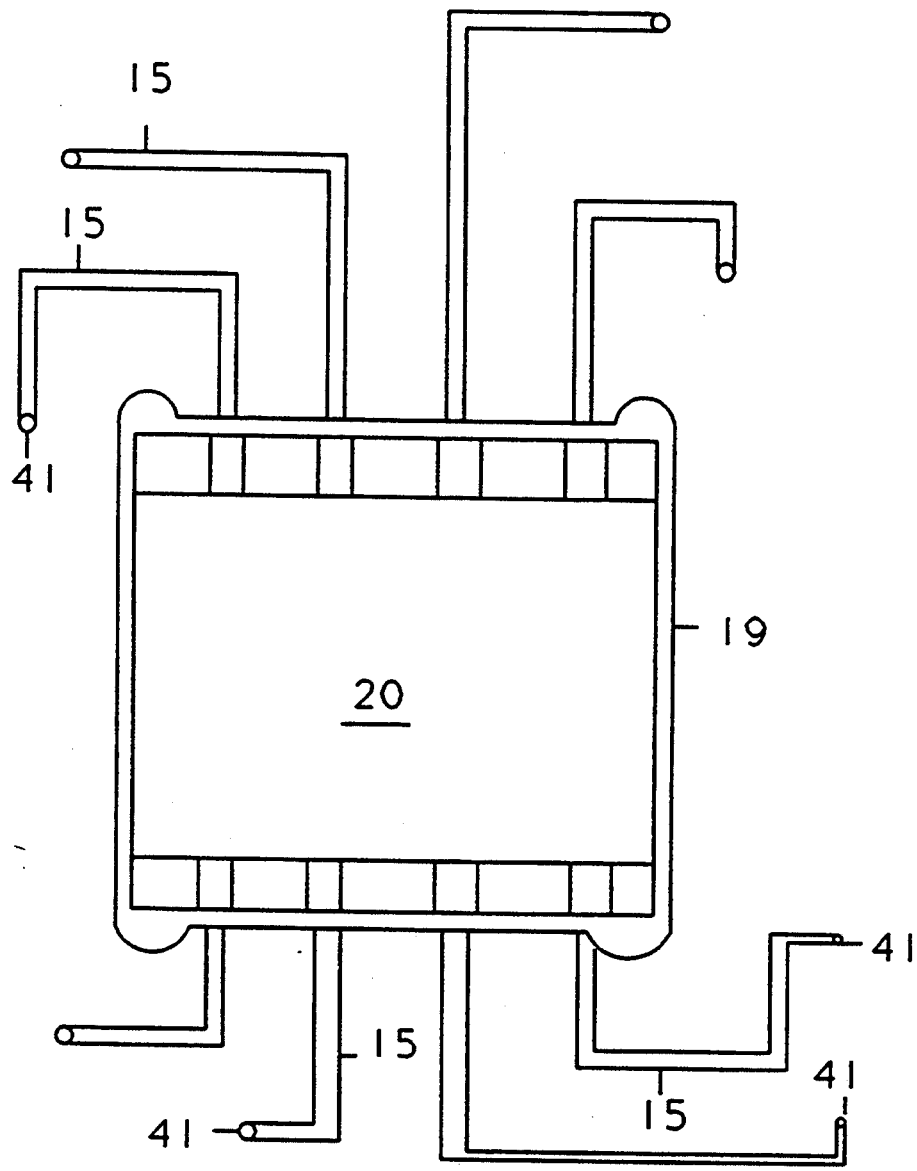
FIG. 2 is a plan view of an RF interconnect structure employing a plurality of channelline feeds of FIG. 1 coupled with a pocket in which a respective circuit component is disposed.

FIG. 1 is a diagrammatic cross-sectional illustration of an embodiment of an interconnect structure in accordance with the present invention, in which both RF and auxiliary signalling capabilities are integrated together a laminate configuration, while FIG. 1A is an end sectional view of FIG. 1 taken along lines A—A of FIG. 1, and FIG. 2 is a plan view of an RF interconnect structure employing a plurality of channelline feeds of FIG. 1 coupled with a pocket in which a respective circuit component is disposed.

More particularly, FIGS. 1 and 1A show the interconnect structure as comprising a conductor-plated dielectric laminate structure in which channelline or waffleline-based RF interconnect is provided in a first dielectric layer, while a plurality of auxiliary signalling lines are provided by way of patterned conductors of multiple additional dielectric layers which are spaced apart from one another and the RF link-supporting dielectric layer in a multiple layer stack.

The RF interconnect portion of the laminate structure, shown generally at 11, is comprised of a first dielectric layer 13 having a channel 15 (e.g. a channelline channel or a waffleline channel) extending from a first (e.g. bottom) surface 14 to a prescribed depth into of the dielectric layer 13. As shown in the plan view of FIG. 2 a plurality of channels 15 may be provided as signalling feeds to form an RF interconnect structure that is coupled with a pocket 19 in which a respective circuit component 20 is captured.

In a preferred embodiment of the invention, dielectric layer 13 comprises a polytetrafluoroethylene (PTFE) material known as RT/Duroid 6002, manufactured by Rogers Corp. Advantageously, this dielectric material has a room temperature, in-plane coefficient of thermal expansion (CTE) equal to that of copper (9 ppm/°F.) and only a slightly higher out-of-plane CTE (16 ppm/°F.). In addition to enjoying such a low CTE, the preferred dielectric material used for the channelline or waffleline substrate also has a low tensile modulus, so that there will be effectively minimal relative movement between a copper plating layer on the dielectric layer and the dielectric itself, thereby substantially eliminating stresses at wire-to-pin joints. This thermal property match also essentially eliminates through-hole failures, a prevalent problem in other multi-layer polytetrafluoroethylene (PTFE) materials. In the present example, dielectric layer 13 may have a thickness on the order of 100 mils.

The surface of a channel 15 is coated with a conductive material (in a preferred embodiment it is plated with a thin layer of copper) 17 and is dimensioned and shaped to accommodate the insertion of a clad wire 21 comprised of conductor 23 clad with a dielectric layer 25 into the channel 15. In the illustrated embodiment, the interiormost surface 16 of channel 15 is semicircular. The dielectric cladding layer 25 of the wire 21 may comprise a Teflon cladding, for example, as described in the previously referenced Heckaman et al patents. In the exemplary structure illustrated in FIGS. 1 and 1A, the dielectric cladding layer 25 is stripped back from the end of the center conductor 23, so as to leave a substantial length 31 of center conductor cladding-free.

This unclad end 31 of the conductor is shown as being bent at a right angle at region 33, and extending upwardly as viewed in FIG. 1, into an aperture 41 which extends completely through dielectric layer 13 from first (bottom) surface 14 to a second (top) surface 18 thereof. Aperture 41 may be cylindrically shaped and, like channel 15, its sidewalls 47 are plated with a layer of copper 48, so that the stripped end 31 of center conductor 23 is spaced apart from a surrounding conductive cylinder (sidewalls 47) by an air gap 51 therebetween. The diameter of cylindrical aperture 41 is dimensioned such that the distributed capacitance in air gap 51 maintains the prescribed characteristic impedance (e.g. 50 ohms) of the channelline. In the illustrated example, aperture 41 has a diameter on the order of 30 mils.

The auxiliary signalling link-supporting laminate structure, which is compactly integrated with the RF signalling channelline structure contained in the first dielectric layer 13, comprises a plurality (e.g. two in the illustrated example) of second, relatively thin dielectric layers 61, 62. By relatively thin is meant that these additional dielectric layers need only be as thick as necessary for electrical insulation and structural support of layers of conductor (e.g. copper) plate which are formed on the layers and serve as the auxiliary signalling lines. With RT/Duroid 6002 as the preferred dielectric material, each of dielectric layers 61, 62 may have a thickness on the order of five mils. In the illustrated embodiment, dielectric layer 61 has a patterned copper layer 71 formed on a first (lower) surface 73 thereof, and dielectric layer 62 has a patterned copper layer 72 formed on a first (lower) surface 74 and a second patterned copper layer 76 formed on a second (upper) surface 77 thereof. Each of dielectric layers 61, 62 has a respective aperture 64, 65 which is coaxial with and together effectively form an extension of aperture 41 through which center conductor 31 passes.

Also shown in the embodiment of FIGS. 1 and 1A is an additional (top) dielectric layer 63, which is thicker than dielectric layers 61 and 62, layer 63 serving as a support member having substantial rigidity for components than may be mounted on its top surface 81. In the presently described embodiment, a copper microstrip layer 83 is patterned on surface 81 and is conductively joined (e.g. soldered at 85) to the stripped end 31 of center conductor 23, which extends through a cylindrical aperture 87 in dielectric layer 63.

The respective dielectric layers 13, 61, 62, 63 are assembled together in a laminate stack by means of respective film layers of adhesive material 91, 93, 95 comprised of a suitable bonding material such as FEP film adhesive. The thickness of each of the respective film adhesive layers may be on the order of two mils, which is sufficient to ensure a secure attachment of adjacent dielectric layers and also to provide a reduced separation between adjacent ones of the dielectric layers.

In the illustrated embodiment, the patterned copper conductor layers 71, 72 on the lower surfaces of respective dielectric layers 61, 62 may serve as signalling lines, such as digital signal control lines and D.C. potential-conveying conductors. Patterned conductor layer 76 on the upper surface 77 of dielectric layer 62 may serve as a ground plane layer and may be connected to copper layer 48 that has been formed on the cylindrical sidewalls 47 of aperture 41, as shown at 92. In order to prevent signal conductor lines 71 and 72 from coming into contact with conductive layer 48, the patterning in lines 71 and 72 is such that there are respective gaps 94 and 96 between the edges of the lines 71 and 72 and apertures 64, 65.

With the auxiliary conductor-supporting dielectric layers stacked in a laminate structure adjacent to the channelline, waffleline layer 13, access to and auxiliary signalling for RF network components (e.g. phase shifters, high power amplifiers, diplexer feeds, microstrip circuits, etc.) that may be captured in respective pockets shown at 19 of FIG. 2, referenced above, and to which the channelline, waffleline structure is to be interconnected, are readily effected by feedthrough connections to the auxiliary conductor structure.

It should be realized that more than the single interconnect aperture 87 shown in FIG. 1 may extend through the first dielectric layer 13, so as to intersect a channel 15 and further through the auxiliary signalling laminate structure. Moreover rather than the center conductor of a channelline wire being stripped of its outer clad and passing through the aperture to be joined (e.g. soldered) to an outermost surface conductor layer, such as microstrip layer 83 on the upper surface of dielectric layer 63, a separate conductor such as a pin extending from a TO-type element which is mounted on the top surface 81 of dielectric layer 63 may pass through the aperture and be joined with the center conductor of the dielectric clad RF link that has been placed in the channel or with one or more auxiliary signalling lines.

Figure 3:
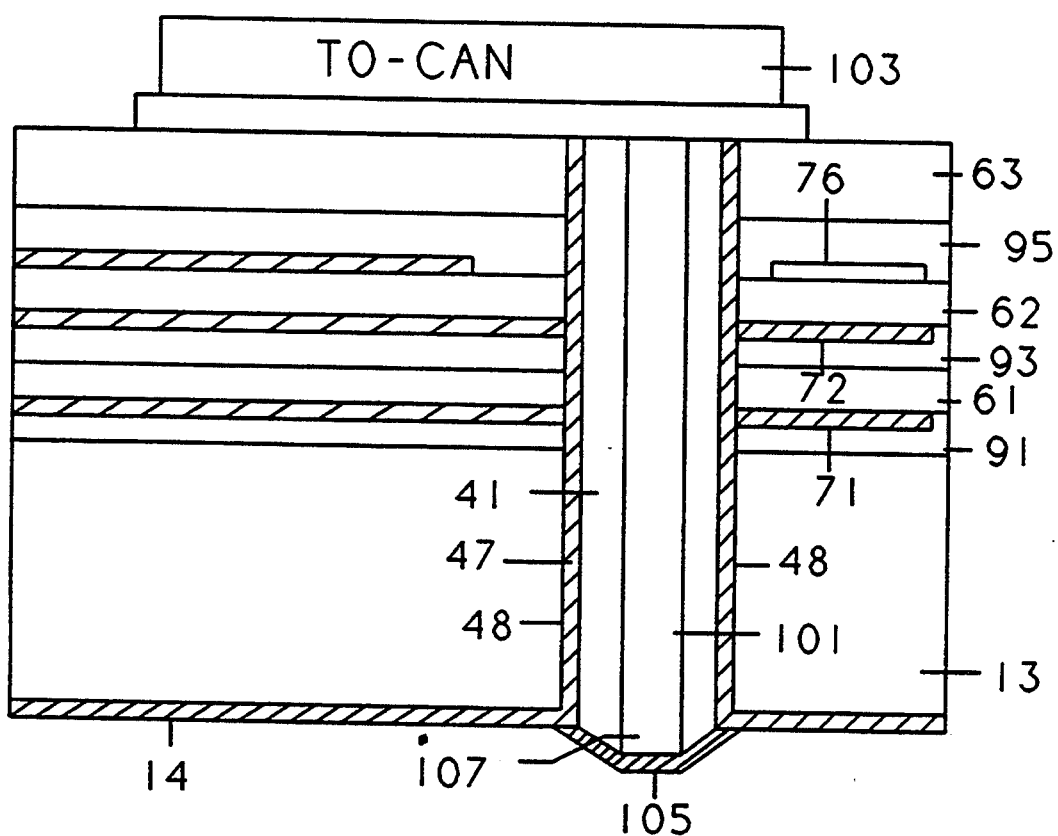
FIG. 3 is a diagrammatic cross-sectional illustration of the connection of a control signalling pin of a surface mounted TO-type element to an auxiliary signalling line within the laminate structure of FIG. 1.

More particularly, as diagrammatically illustrated in FIG. 3, one or more of the patterned auxiliary control conductors 71, 72 and 76 may serve as signalling lines to one or more control signal pins which extend from a circuit element, such as a TO-can. In FIG. 3, such a control pin is shown at 101, extending from the bottom of a TO-can 103, that is mounted on the top surface 81 of dielectric support layer 63. Pin 101 passes through aperture 41 in the laminate structure to the bottom surface 14 of dielectric layer 13. For each auxiliary conductor to which a connection with pin 101 is to be made (e.g. conductors 72, 73), that auxiliary conductor is patterned such that it extends flush with the plated sidewall 47 of aperture 41, whereby plated conductive layer 48 will provide a conductive path from the one or more auxiliary conductor layers of interest to the plated bottom surface 14 of dielectric layer 13. A solder connection 105 is effected between the bottom portion 107 of pin 101 and plated layer 48, thereby providing a conductive connection between the auxiliary signal line or lines and pin 101.

It should also be observed that the surfaces on which auxiliary signalling conductors are patterned are not limited to those shown in FIGS. 1 and 1A. For example, copper layer 72 could just as well be plated on the upper surface 78 of dielectric layer 61 rather than on the lower surface of dielectric layer 62. What is important is that a robust insulative barrier be provided between respective ones of the auxiliary signalling lines in order to prevent a potential electric field breakdown or shorting together of adjacent auxiliary conductor patterns.

As will be appreciated from the foregoing description of the present invention, the previously described shortcomings of conventional auxiliary conductor interconnect mechanisms that are employed in association with channelline and waffleline architectures are obviated by a new and improved interconnect structure in which both RF and auxiliary (e.g. digital and D.C.) signalling capabilities are integrated together by means of a conductor-plated dielectric laminate configuration that facilitates access to and routing by way of both channelline/waffleline RF transmission links and separate control (e.g. digital, power supply) links, without having to perform laborious manual routing tasks to effect auxiliary connectivity among the components of a network.

While we have shown and described several embodiments in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. An interconnect structure which provides RF and auxiliary signalling capabilities comprising:
   a first dielectric layer having a first surface and a channel formed therein, said channel extending through said first dielectric layer parallel to said first surface and having a conductive surface, a dielectric-coated conductor being inserted into said channel so as to extend parallel to said first surface and form an RF transmission line;
   a second dielectric layer having a conductive layer formed on a first surface thereof and being mounted in a laminate assembly with said first surface of said first dielectric layer, said conductive layer conducting auxiliary signals as an adjunct to said RF transmission line.

2. An interconnect structure which provides RF signalling capability and additional signalling capability including digital control and D.C. capability as auxiliary signalling capability comprising:
   an RF transmission line formed of a first dielectric layer having a first surface and a channel formed therein, said channel extending through said first dielectric layer parallel to said first surface and having a conductive surface which serves as the ground plane of said RF transmission line and receiving a dielectric-coated conductor which extends parallel to said first surface and serves as the signal conductor of said RF transmission line; and
   an auxiliary signalling laminate structure which provides said auxiliary signalling capability, said auxiliary signalling laminate structure comprising a plurality of second dielectric layers each of which has a conductive layer formed on a first surface thereof and being mounted together parallel to said first surface of said first dielectric layer in a laminate assembly therewith.

3. An interconnect structure according to claim 2, wherein at least one of said plurality of second dielectric layers has a patterned conductive layer formed on a first surface thereof.

4. An interconnect structure according to claim 2, further including an aperture which extends through said first dielectric layer in a direction orthogonal to said first surface thereof and intersects said channel, and further extends through said auxiliary signalling laminate structure, and wherein a conductor extends through said aperture and is joined with said dielectric-coated conductor.

5. An interconnect structure according to claim 4, wherein at least one of said plurality of second dielectric layers has a patterned conductive layer formed on a first surface thereof.

6. An interconnect structure according to claim 5, wherein one of the second dielectric layers of said auxiliary signalling laminate structure has a ground plane layer formed thereon which is connected to the conductive surface of said channel.

7. An interconnect structure according to claim 6, wherein one of the second dielectric layers of said auxiliary signalling laminate structure has a microstrip layer formed thereon.

8. An interconnect structure according to claim 3, wherein said auxiliary signalling laminate structure includes respective layers of adhesive interleaved with and through which said plurality of second dielectric layers are mounted together with said first dielectric layer in a laminate assembly.

9. An interconnect structure which provides RF and auxiliary signalling capabilities comprising:

a first dielectric layer having a channel formed in a first surface thereof, said channel extending through said first dielectric layer parallel to said first surface and having a conductive surface and receiving a dielectric coated conductor that is inserted into said channel, so as to extend parallel to said first surface of said first dielectric layer and form an RF transmission line;

a plurality of second dielectric layers each of which has a conductive layer formed on a first surface thereof, said plurality of second dielectric layers being mounted together parallel to said first surface of said first dielectric layer in a laminate assembly therewith; and respective layers of adhesive interleaved with and through which said plurality of second dielectric layers are mounted together with said first dielectric layer in said laminate assembly.

10. An interconnect structure according to claim 9, wherein one of said second dielectric layers further includes a conductive layer formed on a second surface thereof which is parallel to its first surface.

11. An interconnect structure according to claim 10, wherein at least one of said plurality of second dielectric layers has a patterned conductive layer formed on a first surface thereof.

12. An interconnect structure according to claim 11, further including an aperture which extends through said first dielectric layer in a direction orthogonal to said first surface thereof and intersects said channel, and further extends through said auxiliary signalling laminate structure, and wherein a conductor extends through said aperture and is joined with said dielectric-coated conductor.

13. An interconnect structure according to claim 12, wherein one of the second dielectric layers of said auxiliary signalling laminate structure has a ground plane layer formed thereon which is connected to the conductive surface of said channel.

14. An interconnect structure according to claim 13, wherein one of said second dielectric layers of said auxiliary signalling laminate structure has a microstrip layer formed on a surface thereof opposite to the first surface of said first dielectric layer in which said channel is formed.

15. An interconnect structure for an RF circuit component, said interconnect structure providing RF signalling capability and additional non-RF signalling capability providing digital control and D.C. capability as auxiliary signalling capability, comprising:

an RF transmission line formed of a first dielectric layer having a first surface and a channel formed therein, said channel extending through said first dielectric layer in a direction parallel to said first surface and having a conductive surface which serves as the ground plane of said RF transmission line and receiving the insertion of a conductor into said channel which extends parallel to said first surface and serves as the signal conductor of said RF transmission line for connection to said RF circuit component; and an auxiliary signalling laminate structure which provides said additional non-RF signalling capability, said auxiliary signalling laminate structure comprising a plurality of second dielectric layers each of which has a conductive layer formed on a surface thereof and being mounted together parallel to said first surface of first dielectric layer in a laminate assembly therewith; and wherein said first dielectric layer and said auxiliary signalling laminate structure include a conductive walled aperture passing therethrough in a direction orthogonal to said first surface of said-first dielectric layer, said conductive walled aperture being conductively connected to one or more conductive layers formed on a surface of said second dielectric layers and being sized to receive therein an auxiliary signalling pin of said RF circuit component, so that electrical attachment of said auxiliary signalling pin of said RF circuit component to said conductive walled aperture provides electrical interconnection between said auxiliary signalling pine and said one or more conductive layers.

16. An interconnect structure according to claim 15, wherein at least one of said plurality of second dielectric layers has a patterned conductive layer formed on a first surface thereof.

17. An interconnect structure according to claim 15, wherein one of the second dielectric layers of said auxiliary signalling laminate structure has a ground plane layer formed thereon which is connected to the conductive surface of said channel.

18. An interconnect structure according to claim 17, wherein one of the second dielectric layers of said auxiliary signalling laminate structure has a microstrip layer formed thereon.

19. An interconnect structure according to claim 15, wherein said auxiliary signalling laminate structure includes respective layers of adhesive interleaved with and through which said plurality of second dielectric layers are mounted together with said first dielectric layer in a laminate assembly.

* * * * *